(12) United States Patent
Beer et al.

(10) Patent No.: US 12,412,815 B2
(45) Date of Patent: Sep. 9, 2025

(54) SEMICONDUCTOR PACKAGE AND METHOD OF MANUFACTURING A SEMICONDUCTOR PACKAGE

(71) Applicant: Infineon Technologies Austria AG, Villach (AT)

(72) Inventors: Thomas Beer, Mauerstetten (DE); Daniel Hoelzl, Unterhaching (DE); Ralf Otremba, Kaufbeuren (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 481 days.

(21) Appl. No.: 17/479,095

(22) Filed: Sep. 20, 2021

(65) Prior Publication Data

US 2022/0102253 A1 Mar. 31, 2022

(30) Foreign Application Priority Data

Sep. 28, 2020 (EP) .................................... 20198813

(51) Int. Cl.
*H01L 23/495* (2006.01)
*H01L 23/00* (2006.01)
*H01L 23/29* (2006.01)
*H01L 25/04* (2023.01)

(52) U.S. Cl.
CPC ...... *H01L 23/49575* (2013.01); *H01L 23/298* (2013.01); *H01L 23/49513* (2013.01);
(Continued)

(58) Field of Classification Search
CPC ............ H01L 23/49575; H01L 23/298; H01L 23/49513; H01L 23/49548;
(Continued)

(56) References Cited

U.S. PATENT DOCUMENTS

2003/0062601 A1* 4/2003 Harnden ............... H05K 3/3426
257/E23.044
2007/0252265 A1* 11/2007 Sander .................... H01L 24/49
257/691

(Continued)

FOREIGN PATENT DOCUMENTS

| EP | 2775520 A2 | 9/2014 | |
|---|---|---|---|
| EP | 3007222 A2 * | 4/2016 | ......... H01L 21/4825 |
| JP | H03266459 A | 11/1991 | |

*Primary Examiner* — Teresa M. Arroyo
(74) *Attorney, Agent, or Firm* — Murphy, Bilak & Homiller, PLLC

(57) ABSTRACT

A semiconductor package includes: a leadframe having first, second and third die pads and leads, each die pad having upper and lower surfaces; first and second power semiconductor devices; a control semiconductor device; and a mold compound. The upper surface of each die pad is arranged within the mold compound. The lower surface of the second die pad is spaced apart from a side face of the semiconductor package by a distance that is greater than a length of the individual leads. The first power semiconductor device is mounted on the upper surface of the first die pad and electrically coupled to the second die pad by one or more first connectors extending between the first device and the upper surface of the second die pad. The upper surface of the second die pad is occupied by the one or more connectors or in direct contact with the mold compound.

20 Claims, 8 Drawing Sheets

(52) U.S. Cl.
CPC .............. *H01L 24/29* (2013.01); *H01L 24/45* (2013.01); *H01L 25/04* (2013.01); *H01L 2224/29* (2013.01); *H01L 2224/45* (2013.01)

(58) Field of Classification Search
CPC ......... H01L 23/49541; H01L 23/49562; H01L 23/49503; H01L 24/29; H01L 24/45; H01L 24/49; H01L 25/04; H01L 2224/29; H01L 2224/45; H01L 2224/32245; H01L 2224/73265; H01L 2224/0603; H01L 2224/48111; H01L 2224/48137; H01L 2224/48247; H01L 2224/48257; H01L 2224/49111; H01L 2224/4917; H01L 2224/49171; H01L 2224/023; H01L 2224/0233; H01L 2224/48237; H01L 2924/18301; H01L 2924/00012
USPC ..................................................... 257/23.037
See application file for complete search history.

(56) References Cited

U.S. PATENT DOCUMENTS

| | | | |
|---|---|---|---|
| 2012/0146211 A1* | 6/2012 | Shiraishi | H01L 23/49562 257/723 |
| 2013/0075882 A1* | 3/2013 | Chen | H01L 23/49503 257/676 |
| 2014/0218885 A1* | 8/2014 | Hosseini | H01L 23/49575 361/767 |
| 2015/0054145 A1* | 2/2015 | How | H01L 23/49548 257/676 |
| 2015/0262997 A1* | 9/2015 | Sato | H01L 29/7786 257/76 |
| 2016/0247751 A1* | 8/2016 | Kinzer | H01L 24/49 |
| 2018/0040540 A1 | 2/2018 | Kasuya et al. | |
| 2019/0221504 A1 | 7/2019 | Nishiyama | |
| 2019/0252301 A1* | 8/2019 | Yang | H01L 23/3107 |
| 2020/0365497 A1 | 11/2020 | Saito et al. | |

* cited by examiner

SEMICONDUCTOR PACKAGE AND METHOD OF MANUFACTURING A SEMICONDUCTOR PACKAGE

BACKGROUND

To date, transistor devices used in power electronic applications have typically been fabricated with silicon (Si) semiconductor materials. Common transistor devices for power applications include Si CoolMOS®, Si Power MOS-FETs, and Si Insulated Gate Bipolar Transistors (IGBTs). More recently, silicon carbide (SiC) power devices have been considered. Group III nitride-based semiconductor devices, such as gallium nitride (GaN) devices, are now emerging as attractive candidates to carry large currents, support high voltages and to provide very low on-resistance and fast switching times.

A semiconductor device is commonly provided in the form of a semiconductor package. The package may include a substrate or a leadframe on which the semiconductor device is mounted and which includes outer contacts which are used to mount the package on a redistribution board such as a printed circuit board. The package also includes internal electrical connections from the semiconductor device to the substrate or leadframe. The package may include a plastic mold compound which covers the semiconductor device and the internal electrical connections.

Packages including several semiconductor devices can be used to simplify circuit design and provide greater efficiency and improve performance by keeping circuit components in close proximity. Published patent application EP 2 775 520 A2 discloses a power quad flat no lead (PQFN) package which includes a driver IC and U-phase, V-phase and W-phase power switches which are situated on a leadframe of the package. However, further improvements to packages including two or more semiconductor devices are desirable in order to further improve the electrical and thermal performance of the package.

SUMMARY

According to the invention, a semiconductor package is provided that comprises a leadframe comprising first, second and third die pads and a plurality of leads, wherein the first, second and third die pads each have an upper surface and a lower surface and are laterally spaced part from one another. The semiconductor package further comprises a first power semiconductor device, a second power semiconductor device, a control semiconductor device and a mold compound. The upper surface of the first, second and third die pads is arranged within the mold compound and the lower surface of the second die pad is spaced apart from a side face of the semiconductor package by a distance that is greater than the length of individual leads of the plurality of leads. The first power semiconductor device is mounted on the upper surface of the first die pad and electrically coupled to the second die pad by one or more first connectors that extend between the first power device and the upper surface of the second die pad. The upper surface of the second die pad is either occupied by the one or more connectors or in direct contact with the mold compound.

In an alternative embodiment, a semiconductor package is provided that comprises a leadframe comprising at least one die pad and a plurality of leads, wherein the die pad has an upper surface and a lower surface and are laterally spaced part from one another. The semiconductor package further comprises at least a first semiconductor device and a second power semiconductor device. The first and second semiconductor device are mounted on the upper surface of a common die pad. A solder stop structure arranged is on or in the upper surface of the first die pad. The solder stop structure may be arranged between the first semiconductor device and the second semiconductor device. In some embodiments, the solder stop structure is a trench formed in the upper surface of the first die pad and/or a structured region of solder resist.

In some embodiments, the one or more first connectors are in contact with the upper surface of the second die pad. For example, the one or more first connectors may be in direct contact with the upper surface of the second die pad, e.g. a bond wire connection, or connected to the upper surface of the second die pad by an intervening material, such as an electrically conductive adhesive or a soft solder.

In some embodiments, the first connector is a bond wire that is bonded to the upper surface of the die pad. In some embodiments, the first connector is a contact clip that is connected to the upper surface of the second die pad by a solder connection. In some embodiments, the first connector is a ribbon that is connected to the upper surface of the second die pad by a solder connection.

In some embodiments, the plurality of leads includes at least one lead that is spaced apart from the die pads and other leads and is denoted an individual lead. In some embodiments, the plurality of leads includes at least one lead that extends from one of the first, second and third die pads.

In some embodiments, the upper surface of the second die pad extends into an upper surface of at least one lead and a lower surface of the at least one lead is spaced apart from the lower surface of the second die pad by the mold compound.

In some embodiments, the first and second power semiconductor devices are mounted on the first die pad and the control device is mounted on the third die pad.

In some embodiments, the first die pad is connected to ground potential. In some embodiments, the first power semiconductor device is a transistor device and the source of the first power semiconductor device is coupled to the first die pad. In some embodiments, the second power semiconductor device includes a ground pad that is coupled to the first die pad which is coupled to ground potential.

In some embodiments, the upper surface of the first die pad extends into a lead and a source of the first power semiconductor device is coupled to the lead by a second connector. The second connector may extend between the source of the first power semiconductor device and the first die pad and/or between the source of the first power semiconductor device and the lead.

In some embodiments, the first power semiconductor device is a lateral transistor device with source, drain and gate contact pads on its upper surface. In some embodiments, the drain contact pad is coupled to the second die pad by the one or more first connectors.

In some embodiments, the second power semiconductor device is a lateral transistor device with source, drain and gate contact pads on its upper surface. In some embodiments, the source contact pad of the second power device is coupled to the second die pad.

In some embodiments, the first and second power semiconductor devices are coupled to form a half-bridge configuration or a cascode configuration.

In some embodiments, the semiconductor package further comprises a solder stop structure arranged on or in the upper surface of the first die pad. The solder stop structure may be arranged between the first power semiconductor device and the second power semiconductor device.

In some embodiments, the solder stop structure has the form of a trench that is formed in the upper surface of the first die pad and/or a structured region of solder resist.

In some embodiments, the upper surface of each of the first, second and third die pads has an area of 4 mm² or greater and a minimum lateral dimension of 1.5 mm and the lead has a lower surface with a maximum area of 3 mm². The upper surface of each of the first, second and third die pads may be square or substantially rectangular. The lateral dimension of the upper surface of the die pad may be the width or the breadth of the upper surface, for example.

According to the invention, a method of fabricating a semiconductor package comprising a first power semiconductor device, a second power semiconductor device and a control semiconductor device is provided. The method comprises providing a leadframe comprising first, second and third die pads and a plurality of leads, wherein the first, second and third die pads each have an upper surface and a lower surface and are spaced part from one another and wherein a lower surface of the second die pad is spaced apart from a side face of the semiconductor package by a distance that is greater than the length of the individual leads. The method further comprises mounting the first power semiconductor device on the upper surface of the first die pad, electrically coupling the first power semiconductor device to the second die pad by one or more first connectors that extend between the first power device and the upper surface of the second die pad, and applying a mold compound such that the upper surface of the first, second and third die pads is arranged within the mold compound and the upper surface of the second die pad is either occupied by the one or more connectors or in direct contact with the mold compound.

In some embodiments, the second power semiconductor device is mounted on the upper surface of the first die pad adjacent the first power semiconductor device and the control device is mounted on the third die pad. The second die pad remains unoccupied by a semiconductor die or semiconductor device.

In some embodiments, the upper surface of the first die pad includes a solder stop structure and the first and second power semiconductor devices are mounted on the upper surface of the die pad such that the solder stop structure is arranged laterally between the first and second power semiconductor devices.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1A:
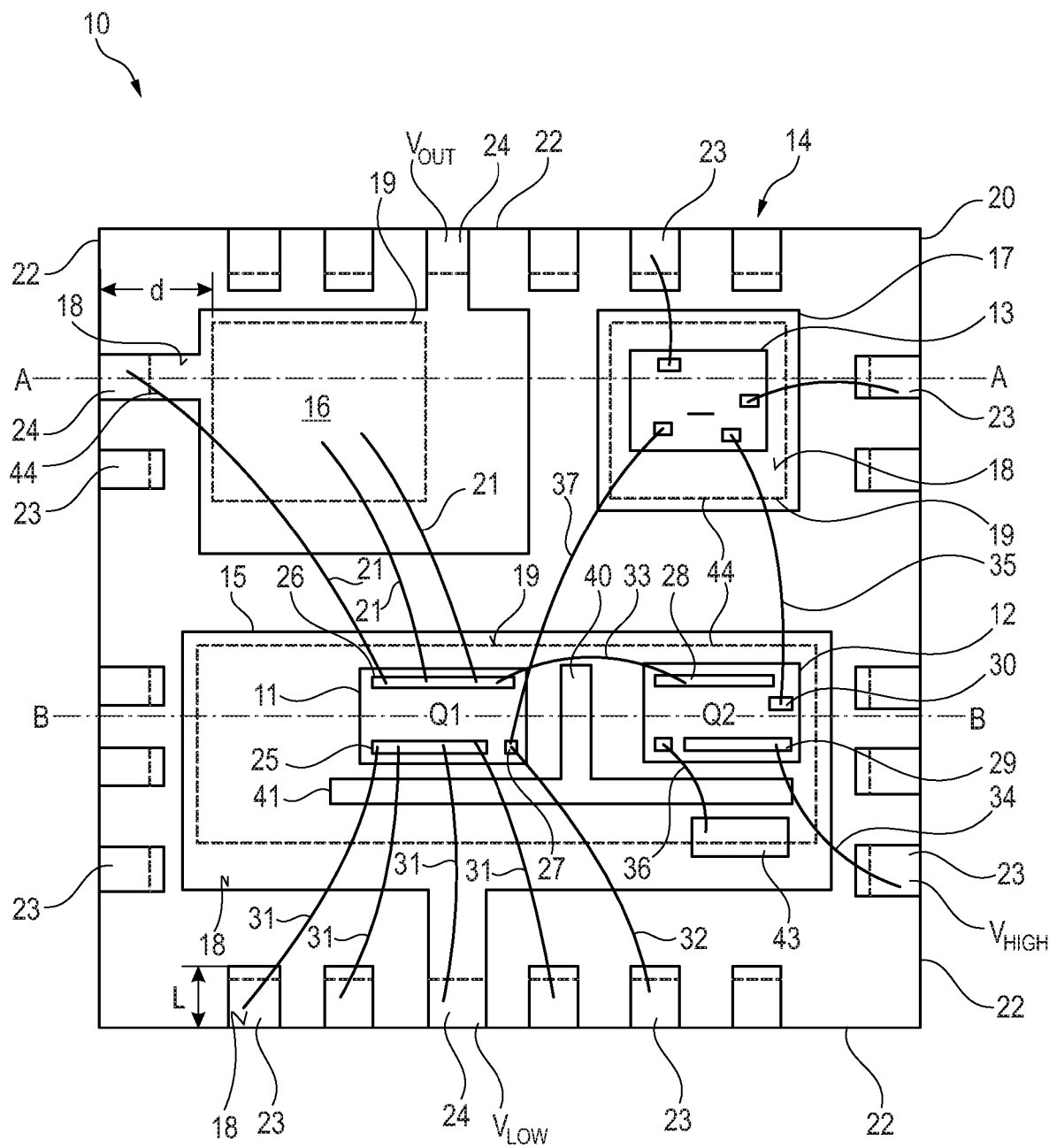
FIG. 1A illustrates a plan view of a semiconductor package according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride and AlGaN refers to an alloy described by the formula $Al_xGa_{(1-x)}N$, where $0<x<1$.

It is desirable to include two or more power devices and at least one control device for the power devices in a single package. The power devices may be used for switching a source of electric power. The power devices may be a transistor device, or a diode for example. The control device may be used for controlling the switching of the power devices. The control device may include gate driver circuitry and may further include additional sensing circuitry, such as current sensing or temperature sensing circuitry.

It is also desirable that the package has a standard package outline or footprint so that the package can be more easily integrated into applications and circuits. However, including several semiconductor devices in a single package leads to challenges in terms of thermal performance, since in operation each device generates heat which has to be dissipated from the package. Additionally, increasing power requirements of the power devices, for example by the use of high-voltage devices such as Group III nitride devices in place of low voltage devices, also has challenges in providing an internal rewiring structure which can support higher currents without leading to overheating of the devices and package, since poor thermal dissipation can reduce or even limit the electrical performance of the package.

According to embodiments described herein, these challenges are addressed by using a die pad solely as part of the internal electrical redistribution structure of the package rather than as a support structure for a semiconductor device. Thus, an electrical connection having a larger cross-sectional area and, therefore, reduced resistance can be provided which leads to a reduction in heat generation, thus improving the thermal and electrical performance of the package. In some embodiments, for example in embodiments in which the semiconductor package has a standard outline and/or standard footprint, the semiconductor device which would commonly be mounted on this die pad is instead mounted on the same die pad as a further semiconductor device.

FIGS. 1A to 1F illustrate a semiconductor package 10. FIG. 1A illustrates a plan view of the semiconductor package 10 which includes a first power semiconductor device 11, a second power semiconductor device 12 and a control semiconductor device 13. The semiconductor package 10 also comprises a leadframe 14 which includes a first die pad 15 a second die pad 16, a third die pad 17. Each of the first, second and third die pads 15, 16, 17 has an upper surface 18 and a lower surface 19 that opposes the upper surface 18. The first second and third die pads 15, 16, 17 are laterally spaced apart from one another.

The leadframe 14 further includes a plurality of leads 23, 24. In this embodiment, the leads 23, 24 are arranged at the peripheral edge of four side faces 22 of the semiconductor package 10. In other embodiments, the plurality of leads 23, 24 may be arranged at the periphery of a single side face 22, two opposing side faces 22 or three side faces 22 of the semiconductor package 10. Some leads of the plurality of leads are separate, individual leads 23 that are spaced apart from the die pads 15, 16 and 17 and one another. Some leads 24 of the plurality of leads extend from and are integral with one of the die pads.

Each of the individual leads 23 has a length L which is defined as the dimension of the upper surface 18 of the lead 23 which extends substantially perpendicularly to the side face 22 of the semiconductor package 10. Each of the individual leads 23 is spaced apart from other portions of the leadframe, including other individual leads 23 and from the first, second and third die pads 15, 16, 17. The leads 24 that extend from and are integral with one of the die pads are therefore distinguishable from the individual leads 23 having a length L.

Figure 1B:
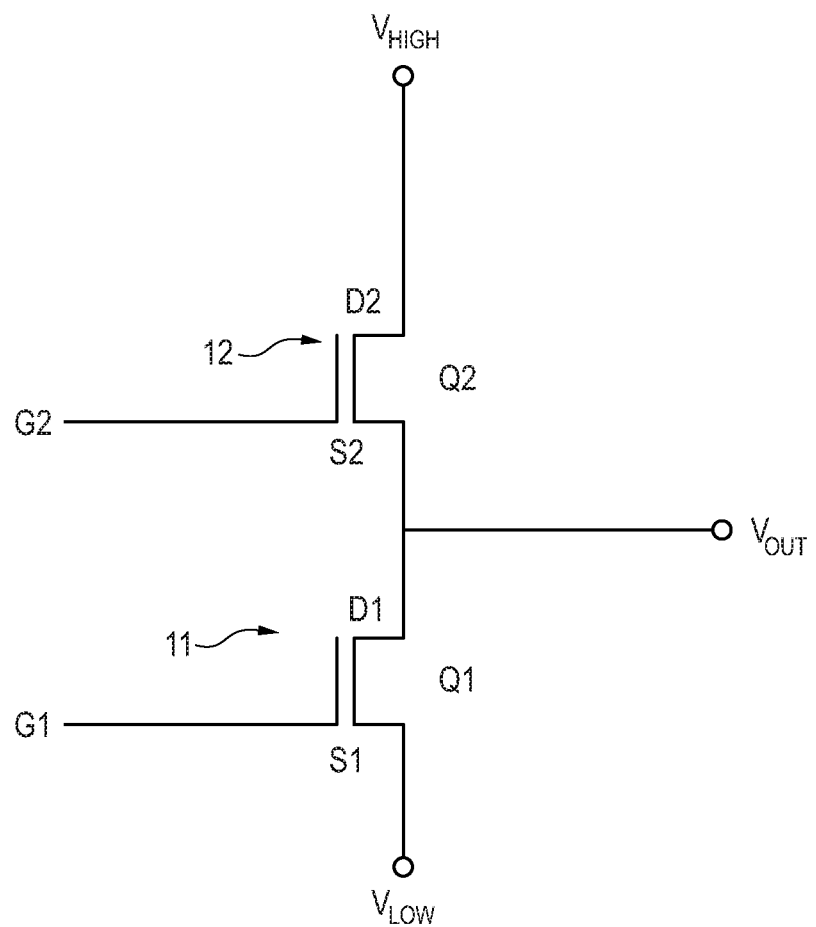
FIG. 1B illustrates a circuit diagram of a half bridge configuration that is provided by the package of FIG. 1A.

The semiconductor package 10 further includes a mold compound 20. The upper surface 18 of the first, second and third die pads 15, 16, 17 is arranged within mold compound 20 as can be seen in the cross-sectional view of FIG. 1C. The upper surface 18 of the first, second and third die pads 15, 16, 17 and of the leads 23, 24 may be substantially coplanar. As can also be seen in the cross-sectional view of FIG. 1C, the lower surface 19 of both types of leads 23, 24 is substantially coplanar and uncovered by the mold compound 20. The lower surface 19 of both types of leads 23, 24 provides an outer contact surface 44 of the semiconductor device 10. The outer contact surfaces 44 provide the footprint 45 of the semiconductor package 10. FIG. 1D illustrates a plan view of the lower surface of the semiconductor package 10 and, therefore, of the footprint 45 and the outer contact surfaces 44. In this embodiment, the outer contact surfaces 44 are substantially coplanar and are largely arranged within the area covered by the mold compound 20 and within the contour as defined by the side faces 22 of the mold compound 20.

In some embodiments, the lower surface 19 of one or more of the first, second and third die pads 15, 16, 17 is uncovered by the mold compound 20 and also provides an outer contact surface 44 and/or cooling surface. Such a cooling surface can be mounted on an external heat sink, for example, to further improve the dissipation of heat from the semiconductor device that is mounted on that die pad away from the package.

The first power semiconductor device 11 is mounted on the upper surface 18 of the first die pad 15. The first power semiconductor device 11 is electrically coupled to the second die pad 16 by one or more first connectors 21 which extend between the first power semiconductor device 11 and the upper surface 18 of the second die pad 16. As can be seen in the cross-sectional view of FIG. 1C, the lower surface 19 of the second die pad 16 is spaced apart from a side face 22 of the semiconductor package 10 by a distance d which is greater than the length L of the individual leads 23 of the leadframe 14.

The upper surface 18 of the second die pad 16 is either occupied by one or more of the connectors 21 which is coupled to the first power semiconductor device 11 or is in direct contact with the mold compound 20. The second die pad 16 is not used to support a semiconductor device and is used solely as part of the internal electrically conductive redistribution structure from the first power semiconductor device 11 to the leads 23, 24 providing the outer contact surfaces 44 of the semiconductor package 10. The connector 21 may be bonded to the upper surface 18 of the second die pad 16 directly in the case of a bond wire, for example, or may be in contact with an additional material acting as an adhesive, for example, a polymer-based adhesive such as an electrically conductive epoxy resin or solder, for example soft solder, which is used to electrically and mechanically connect the first connector 21 to the upper surface 18 of the second die pad 16. A solder or adhesive connection may be used if the connector 21 is a contact clip or a ribbon, for example. The upper surface 18 of the second die pad 16 is, therefore, either occupied by the first connector or in contact with the mold compound 20.

Figure 1C:
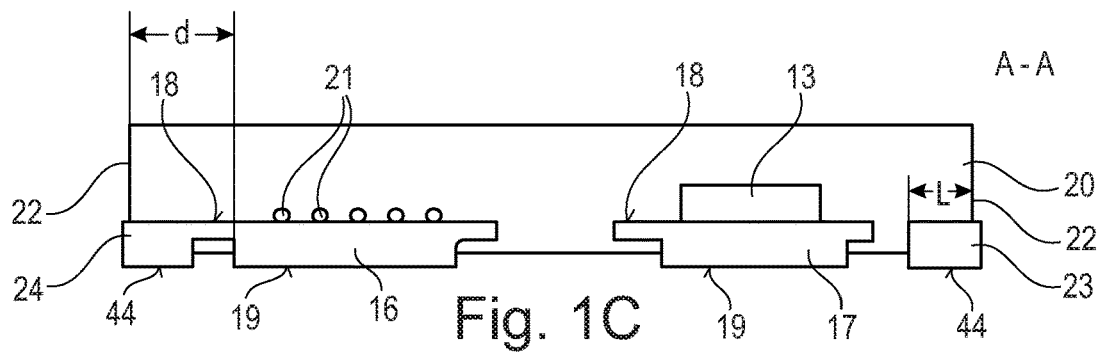
FIG. 1C illustrates a cross-sectional view along the line A-A shown in FIG. 1A.
Figure 1D:
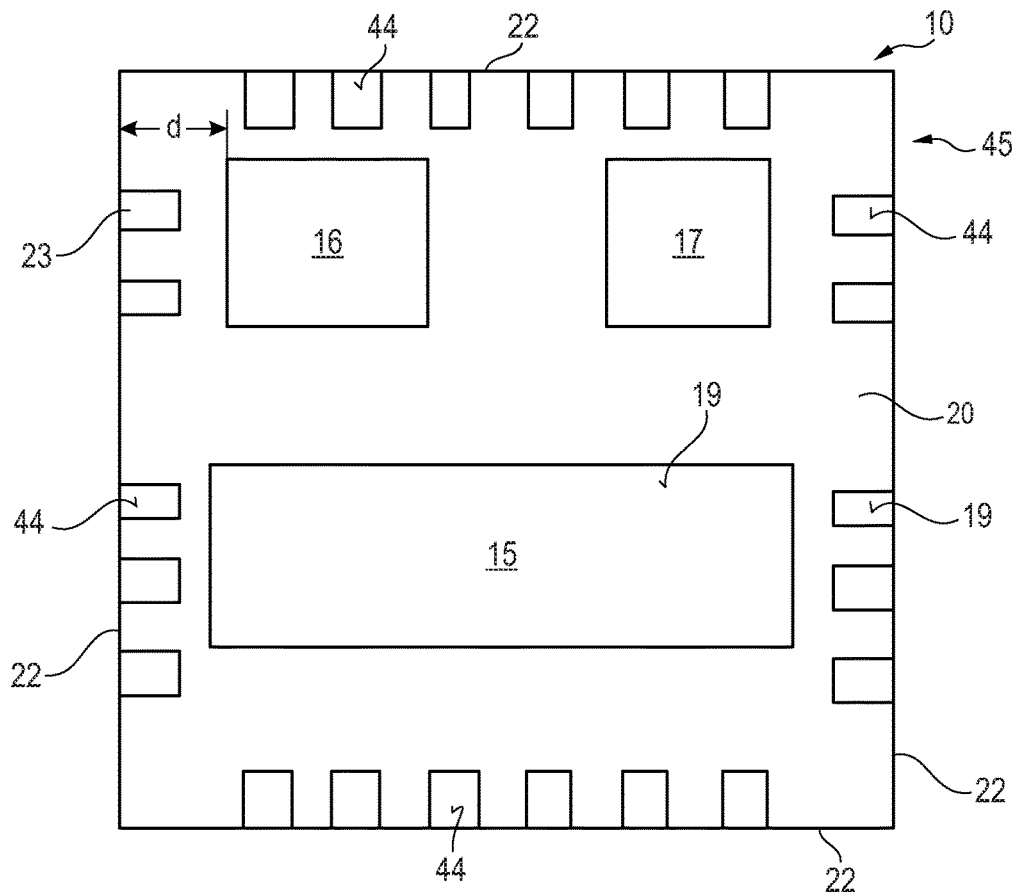
FIG. 1D illustrates a view of the lower surface and footprint of the semiconductor package of FIGS. 1A and 1B.

FIG. 1C illustrates a cross-sectional view along the line A-A shown in FIG. 1A and illustrates a cross-sectional view of a lead 24 that extends from the second die pad 16. The lower surface 19 of the lead 24 is spaced apart from the lower surface 19 of the second die pad 16 by a portion of the mold compound 20 whereas the upper surface 18 of the lead 24 extends into and is integral with the upper surface 18 of the second die pad 16. An internal redistribution structure is provided that is positioned within the mold compound 20 and that extends from the die pad 16 to the outer contact area 44 on the lower surface 19 of the lead 24.

Referring to the plan view of FIG. 1A and the cross-sectional view of FIG. 1C, in some embodiments, the upper surface 18 of the second die pad 16 has a larger lateral area than the opposing lower surface 19 of the second die pad 16. The size and shape of the upper surfaces 18 of the first and third die pads 15, 17 may also differ from the size and shape of the lower surfaces 19. Additionally, the upper surface 18 of the individual leads 23 as well as the upper surface of the leads 24 which are integral with one or one of the die pads 15, 16, 17 may also be larger than the lower surface 19 of the respective lead 23, 24 which is exposed from the mold compound 20 are forms an outer contact area 44 of the package and the package footprint 45. This arrangement may be used to increase the area available for mounting semiconductor device(s) on the die pad(s) and for attaching or bonding connectors to the upper surface 18 of the leads 23, 24 whilst the lower surface 19 of the leads 23, 24, which provides an outer contact area 44 of the package 10, has substantially the same area and a predefined position in the footprint 45 of the semiconductor device 10. This structure can be achieved by removing a portion, for example by half-etching, the lower surface of the leadframe 14.

As defined herein, a die pad has an upper surface having an area which is at least 4 mm$^2$. Thus, an arrangement in which several neighbouring pins are electrically connected at the upper surface by a connecting web portion of the leadframe, for example to form an area suitable for accepting a contact clip connector, is excluded from the definition of the die pad, since firstly, such an arrangement is not sufficiently laterally large to support a semiconductor device or die and, secondly, has lateral area which is smaller than 4 mm$^2$.

In some embodiments, the upper surface of each of the first, second and third die pads 15, 16, 17 has an area of 4 mm$^2$ or greater and a minimum lateral dimension of 1.5 mm. The lateral dimension may be a width or breadth of the upper surface 18 of the die pad 15, 16, 17. The individual leads 23 as well as the leads 24 which are integral with one of the die pads each has a lower surface with maximum area of 3 mm$^2$. Thus, referring to FIGS. 1A to 1F, the upper surface 18 of second die pad 16 has an area of 4 mm$^2$ or greater and a minimum lateral dimension of 1.5 mm and is distinguishable from an individual lead 23 or integral lead 24 of the leadframe 14 which has a lower surface having a maximum area of 3 mm$^2$.

In the semiconductor package 10 illustrated in FIG. 1A, the second die pad 16 is positioned in a first corner and the third die pad 17 is positioned in a second corner of the semiconductor package 10 and laterally adjacent the second die pad 16. The first die pad 15 extends substantially across the entire width of the package 10 such that the second die pad 16 and the third die pad 17 are positioned adjacent and spaced apart from a common side face of the first die pad 11. However, other arrangements of three of more die pads may be used, whereby at least one of the die pads is, in the final moulded package, free of a semiconductor device and used solely as a portion of the internal electrically conductive redistribution structure between one or more of the semiconductor devices and one or more outer contact surfaces 44 of the semiconductor package 10, for example the lower surfaces 19 of the leads 23, 24 of the package or a lower surface of one or the die pads 15, 16, 17.

Two or more power semiconductor devices are mounted on a single die pad. In the embodiment illustrated in FIG. 1A, the first power semiconductor device 11 and the second power semiconductor device 12 are both mounted on the upper surface 18 of the first die pad 15 laterally adjacent one another. The control semiconductor device 13 is mounted on a different die pad from the first and second power semiconductor devices 11, 12 and, in this embodiment, is mounted on the upper surface 18 of the third die pad 17.

Depending on the first and second power semiconductor devices 11, 12 and the internal redistribution structure, various types of circuits can be formed provided by the semiconductor package 10. In some embodiments, the semiconductor package 10 provides a half bridge circuit, or a cascode circuit.

The semiconductor package 10 illustrated in FIG. 1A provides a half bridge circuit. FIG. 1B illustrates a circuit diagram of the half bridge circuit. In this embodiment, the first power semiconductor device 11 is a transistor device and the second power electronic device 12 is also a transistor device. The first power semiconductor device 11 provides the low side switch Q1 of the high bridge circuit and the second power semiconductor device 12 provides the high side switch Q2 of the half bridge circuit. The control device 13 comprises gate driver circuitry for driving the gates of the low side switch Q1 and high side switch Q2.

The first and second semiconductor devices 11, 12 are both mounted on the upper surface 18 of the first die pad 15 and adjacent and spaced apart from one another. In the semiconductor package 10, the first power semiconductor devices 11 is provided by a lateral transistor device Q1 which includes a source pad 25, a drain pad 26 and gate pad 27 on its upper surface. Similarly, the second power semiconductor device 12 is provided by a lateral transistor device Q2 that includes a source pad 28, a drain pad 29 and a gate pad 30 on its upper surface. The first and second power semiconductor devices 11, 12 may be high-voltage transistor devices and/or Group III nitride-based transistor devices, for example Group III nitride based HEMTs (High Electron Mobility Transistor).

In the semiconductor package 10, the drain pad 26 of the low side switch Q1 is electrically coupled by the one or more connectors 21 to the second die pad 16. In this embodiment, the electrical connection between the drain pad 26 of the low side switch Q1 and the second die pad 16 is provided by a plurality of bond wires 21 which are arranged in a row along the elongate drain pad 26. One or more of the bond wires 21 may also be connected to the upper surface 18 of one or more of the leads 24 which are integral with the second die pad 16 or one or more individual leads 23. The increased area of the upper surface 18 of the second die pad 16 and the lead 24 is used to enable a larger number of bond wire connections between the drain pad 26 and upper surface of the die pad 16 than would be possible if the connectors 21 were to be connected only to the upper surface 19 of individual leads 23 of the package 10. Therefore, the electrical resistance of the connection between the drain pad 26 of the low side switch Q1 and the second die pad 16 is reduced due to the increased cross-sectional area of the electrical connection. This increased cross-sectional area of the electrical connection can assist in reducing the generation of heat in the connection and assist in improving the thermal and electrical performance of the semiconductor package 10.

The source pad 25 of the transistor device Q1 is electrically connected to one or more individual leads 23 by one or more connectors 31. The connector 31 may be a bond wire, as in the embodiment illustrated in FIG. 1A, or may be a contact clip or ribbon. In the embodiment illustrated in FIGS. 1A to 1F, one or more leads 24 are integral with the first die pad 15. One or more connectors 31 can also be arranged so as to extend between the source pad 25 and the upper surface 18 of the integral lead 24. The first die pad 15 is, therefore, electrically connected to source potential of the low side switch Q1 of the half bridge circuit. Source potential may be ground potential. The gate pad 27 is electrically connected by one or more connectors 32 to an individual lead 23 which is spaced apart from the first die pad 15. The control chip 13 is also connected to the gate pad 27 of the transistor device Q1 by one or more connectors 37.

The second power semiconductor device 12, which provides the high side switch Q2 of the half-bridge circuit, includes a source pad 28 which is electrically coupled to the drain pad 26 of the first power semiconductor device 11 by one or more connectors 33, a drain pad 29 which is electrically connected to one or more leads 23 by one or more connectors 34 and a gate pad 30 which is electrically connected to the control chip 13 by one or more connectors 35 to form the half bridge circuit. The second power semiconductor device 12 may also be electrically coupled to the first die pad 15 by one or more connectors 36 to provide a ground connection.

In this embodiment, the lower surface 19 of the second die pad 16 and of the leads 24 that are integral with the second die pad 16 provide the $V_{out}$ terminal of the half bridge circuit. The first die pad 15 and leads that are coupled to the source pad of the low side switch Q1 by connectors 31 provide the $V_{low}$ terminal of the half bridge circuit. The lead that is coupled to the drain pad 29 of the high side switch Q2 by the connector 34 provides the $V_{high}$ terminal of the half bridge circuit.

Figure 1E:
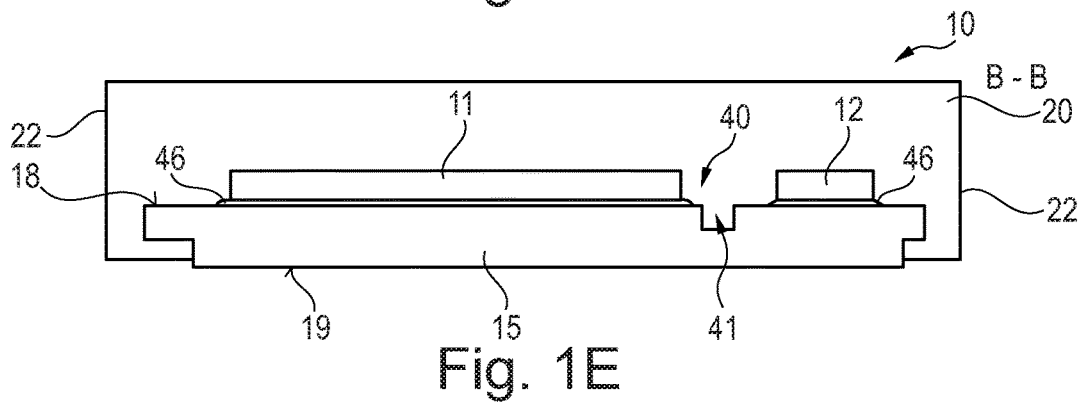
FIG. 1E illustrates a cross-sectional view along the line B-B shown in FIG. 1A.
Figure 1F:
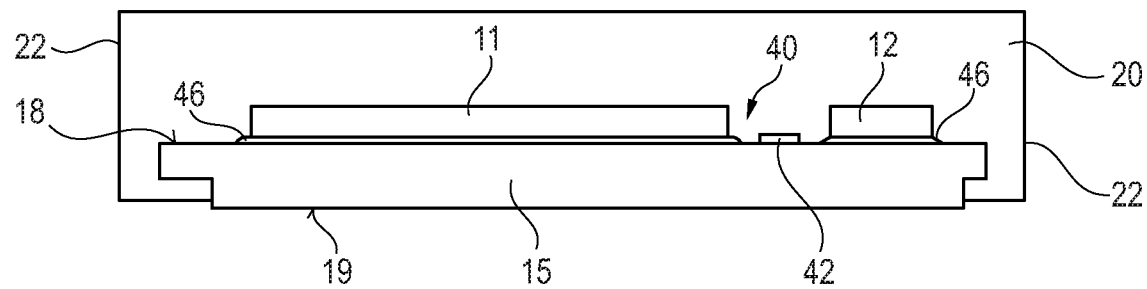
FIG. 1F illustrates a cross-sectional view of an alternative solder stop structure.

The two power semiconductor devices 11, 12 are each mounted on the upper surface 18 of a common die pad 15 by a solder connection 46 that can be seen in the cross-sectional view of FIG. 1E. In some embodiments, the semiconductor package 10 further includes a solder stop structure 40 which is arranged on or in the upper surface 18 of the first die pad 15 and laterally between the first power semiconductor device 11 and the second power semiconductor device 12.

In some embodiments, the solder stop structure 40 may be provided by a trench 41 which is formed in the upper surface 18 of the first die pad 15, as is illustrated in the cross-sectional view of FIG. 1E along the line B-B of FIG. 1A. In other embodiments, such as that illustrated in FIG. 1F, the solder stop structure 40 is formed by structured region of solder resist 42 which is formed on the upper surface 18 of the first die pad 15.

A trench 41 may be used to collect excess solder material that melts during a solder reflow process, for example, so as to avoid it flowing laterally into regions in which it is not wanted. A solder resist structure may be used to contain solder material in the region around the power semiconductor devices, for example.

In some embodiments, a combination of these approaches may be used such that a trench 41 is formed in the upper surface 18 of the first die pad 15 at a position which is laterally between the first and second power semiconductor devices 11, 12 and is coated or filled with a solder resist material 42.

In some embodiments, the solder stop structure 40 extends along substantially the entire length between the facing side faces of the first and second power semiconductor devices 11, 12. In some embodiments, the solder stop structure 40 is arranged between the first or second power semiconductor device and individual leads 23 which are arranged adjacent one or more sides of the first die pad 15, for example, the individual leads to which the first power semiconductor device 11 is connected by additional connector(s) 31. The solder stop structure may also surround each of the power semiconductor devices uninterruptedly.

In embodiments in which one or more connectors is provided between one or more of the first and second power semiconductor devices 11, 12 and the upper surface 18 of the first die pad 15, for example, the connector 36 providing a ground connection for the high side switch Q2, a solder stop structure 40 can also be positioned between the side face of the power semiconductor device 12 and the bond pad or area 43 for the connector 36 on the upper surface 18 of the first die pad 15 in order to stop the spread of the solder onto the bonding pad or area 43.

Figure 2:
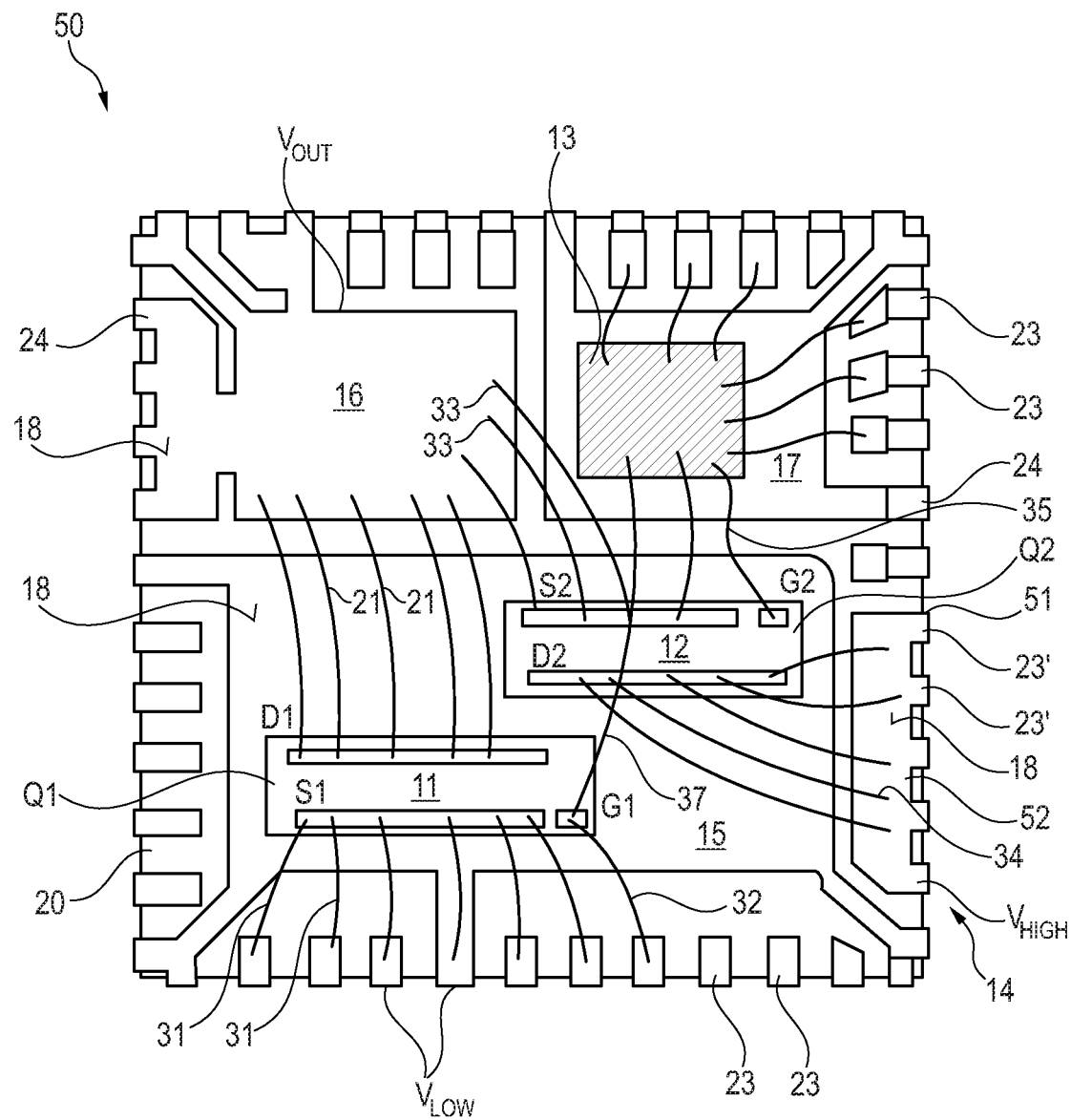
FIG. 2 illustrates a plan view of a semiconductor package according to an embodiment.

FIG. 2 illustrates a semiconductor package 50 according to an embodiment. The semiconductor package 50 includes a first power semiconductor device 11 and a second power semiconductor device 12 which are mounted on the upper surface 18 of the first die pad 15, a control semiconductor device 13 mounted on the upper surface 18 of a third die pad 17 and a second die pad 16 which is remains unoccupied by semiconductor devices and also semiconductor material similar to the embodiments described with reference to FIGS. 1A to 1F. In the semiconductor package 50, the second die pad 16 is used as part of a conductive redistribution structure between the first and second power semiconductor devices 11, 12 and the outer contact areas 44 of the semiconductor package 50.

In this embodiment, the first and second power semiconductor devices 11, 12 are provided by transistor devices Q1, Q2 that may be Group III nitride-based lateral transistor devices, for example. These Group III nitride-based lateral transistor devices commonly have a smaller lateral area which makes them more suitable for mounting on a common die pad, for example the first die pad 15, so as to be able to leave at least one of the die pads of a standard package outline, in this embodiment the second die pad 16, free and unoccupied by a semiconductor device. Therefore, the second die pad 16 is able to act solely as a portion of the electrical redistribution structure between the power semiconductor devices 11, 12 and the outer contact areas 44 of the package 10 that are electrically connected to or formed by the lower surface of the second die pad 16.

The semiconductor device 50 provides a half bridge circuit in which the first power semiconductor device 11 provides the low side switch Q1 and the second power semiconductor device 12 provides the high side switch Q2. The first power semiconductor device 11 comprises a lateral transistor having a source pad 25, a drain pad 26 and a gate pad 27 on an upper surface. The second power semiconductor device 12 provides the high side switch Q2 and comprises a lateral transistor device having a source pad 28, a drain pad 29 and gate pad 30 on an upper surface. The electrical connection between the drain pad 26 of the low side switch Q1 and the second die pad 16 is provided by one or more electrically conductive connectors 21 as in the embodiments described with reference to FIGS. 1A to 1F.

The first die pad 15 is electrically coupled to source potential. In the embodiment illustrated in FIG. 2, this electrical connection is provided by a connector 31 which extends from the source pad 25 of the low side switch Q1 to a lead 24 which is integral with the die pad 15. The gate pad 27 of the low side switch Q1 is electrically connected to the control device 13 by a connector 32, e.g. a bond wire.

In embodiment illustrated in FIG. 2, the electrically conductive connector or connectors 33 from the source pad 28 of the high side switch Q2 extends to the second die pad 16 rather than extending directly between the first and second power semiconductor devices 11, 12 and, in particular, between the source pad 28 of the high side switch Q2 and the drain pad 26 of the low side switch Q1 as in the embodiment illustrated in FIGS. 1A to 1F. In this embodiment, the second die pad 16 provides the node or $V_{out}$ terminal of the half bridge circuit. The $V_{out}$ terminal may also be referred to as the $V_{switch}$ or $V_{SW}$ terminal.

The semiconductor package 50 also provides an example of a structure 51 formed from a plurality of leads 23' which are electrically connected to one another by a connection strip or web 52 to provide a larger bonding area. The larger bonding area may be used to accommodate a plurality of bond wires, or a contact clip. In the embodiment illustrated in FIG. 2, a plurality of bond wires 34 extends from the drain pad 29 of the high side switch Q2 to the structure 51 and to the outer contact surfaces 44 of the semiconductor device 50 positioned on the lower surface of the structure 51. The lateral area of the upper surface 18 of this structure 51 is, however, less than 4 mm² and therefore distinguishable from the second die pad 16. The gate pad 35 of the high side switch Q2 is connected to the control device 13 by a connector 35.

In some embodiments, the lower surface of the web portion 52 is covered by the mold material 20 so that the footprint 45 of the semiconductor package 50 includes a plurality of outer contact surfaces 44 that are spaced apart from one another and have a size, shape and position that corresponds to the outer contact surfaces 44 provided by the individual leads 23 and integral leads 24. This arrangement may be formed by half etching the lower surface of the leadframe. In some embodiments, the lower surface of the web 52 is substantially coplanar with the lower surfaces 19 of the leads 23' and is exposed from the mold material 20 in the lower surface of the semiconductor package 50.

FIG. 2 also illustrates an example of a semiconductor package 50 without a solder stop structure on or in the upper surface 18 of the first die pad 15 that is arranged between the first and second power semiconductor devices 11, 12.

In some embodiments, the footprint of the semiconductor package 10, 50 conforms to a standard JEDEC footprint. The upper surface 18 of the die pads 15, 16, 17 and one or more of the leads 23, 24 may have a larger area than the area of the lower surface of the die pads 15, 16, 17 and the leads 23, 24 providing the outer contact areas 44 of the footprint and may have a contour which differs from the footprint of the semiconductor package. This may be useful in allowing the increased area for the upper surface 18 to accommodate the two power semiconductor devices 11, 12 on a common one of the die pads, for example the first die pad 15, without affecting the standard footprint of the semiconductor package. This allows greater flexibility in the use of the package 10, 50 without necessitating a change in the footprint 45 and a change in the contact areas on the higher-level circuit board on which the package 10, 50 will be mounted. The use of a standard footprint simplifies integration of the package into existing applications and circuits, since the circuit board or application does not need to be adapted to accept the package 10, 50 with improved electrical and thermal performance.

Figure 3:
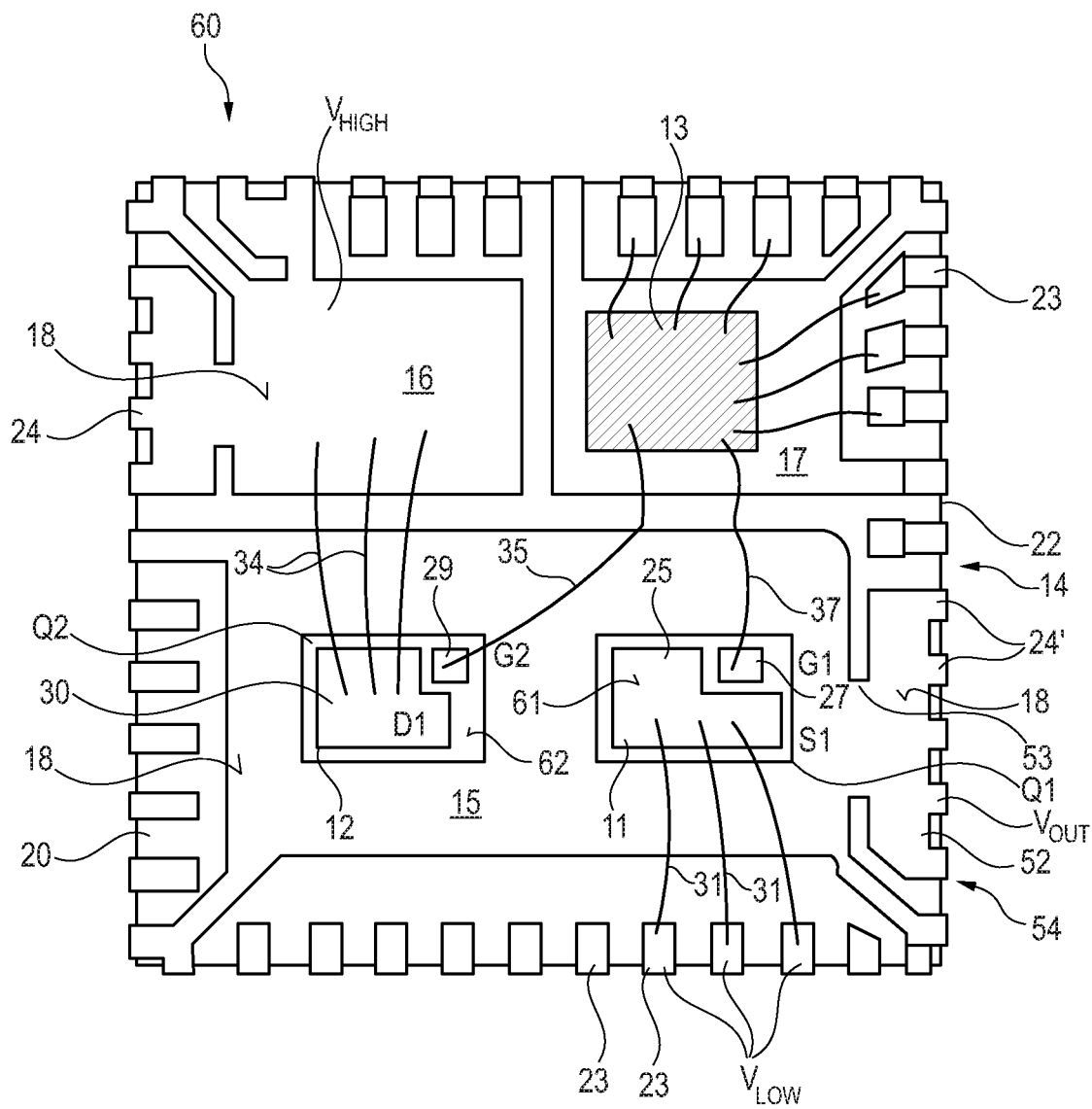
FIG. 3 illustrates a plan view of a semiconductor package according to an embodiment.

FIG. 3 illustrates a semiconductor package 60 which includes the three die pads 15, 16, 17, the first power semiconductor device 11 and the second power semiconductor device 12, which are arranged on the upper surface 18 of the first die pad 15, and a control device 13 arranged on the upper surface 18 of the third die pad 17. The second die pad 16 remains unoccupied by a semiconductor device and is used solely as to provide a portion of the internal electrically conductive redistribution structure of the semiconductor package 60. The first and second power semiconductor devices 11, 12 comprise first and second transistor devices Q1, Q2, respectively, that are electrically coupled so as to form a half bridge circuit. The control device 13 may include gate driver circuitry for driving the gates of the transistor devices Q1 and Q2.

In the embodiment described with reference to FIG. 3, the first power semiconductor device 11 is a vertical transistor device, for example a silicon based MOSFET device, with a vertical drift path, and comprises a source pad 25 and gate pad 27 on an upper surface 61. The drain pad 26 is on the lower surface of the first power semiconductor device 11 and is mounted on and electrically coupled to the first die pad 15. The source pad 25 is electrically coupled to one or more individual leads 23 of the leadframe 14 by one or more bond wires 31 and the gate pad 27 is electrically coupled to the control device 13 by a bond wire 37.

The second power semiconductor device 12 is also provided by a vertical transistor device, for example a silicon based MOSFET device, with a vertical drift path. In this embodiment, the vertical transistor device 12 includes the drain pad 30 and the gate pad 29 on its upper surface 62 and the source pad 28 on its lower surface. The source pad 28 is mounted on and electrically connected to the upper surface 18 of the first die pad 15 and is electrically coupled to the drain pad 26 of the first power semiconductor device 11 which is also mounted on and electrically connected to the first die pad 15. In this embodiment, the drain pad 15 and leads 24 which are integral with the first die pad 15 provide the node of the half bridge circuit and the $V_{out}$ terminal of the package 60.

In the leadframe 14, leads 24' which are integral with the first die pad 15 form a structure 54 in which the leads 24' are connected by a web portion 52 that extends substantially perpendicularly to the side of first die pad 15. The web portion 52 is connected to the first die pad 15 by a further web portion 53 that extends substantially perpendicularly to the web portion 52. The lower surface of the web portion 52 may be substantially coplanar with the lower surfaces 19 of the leads 24' and exposed from the mold material 30 to form an outer contact surface 44 of the semiconductor package 60. In other embodiments, the lower surface of the web portion 52 is recessed from the lower surface 19 of the leads 24' and covered by the mold material 20 so that the structure 54 provides a plurality of outer contact surfaces 44 that are spaced apart from one another at the side face 22 of the mold compound 20.

The drain pad 30 of the second power semiconductor device 12 providing the high side switch Q2 is electrically coupled to the second die pad 16 by one or more connectors 34. In this embodiment, the second die pad 16 and the leads 24 which are integral with the second die pad 16 provide the high-voltage terminal $V_{high}$ of the half bridge circuit. The gate pad 29 of the high side switch Q2 is electrically coupled to the control device 13 by conductive connector 35. Since the drain pad 26 and the source pad 28 of the two semiconductor devices 11, 12 are electrically connected to the common die pad 15 on which they are mounted, a solder stop structure on or in the first die pad 15 is omitted in this embodiment.

Figure 4A:
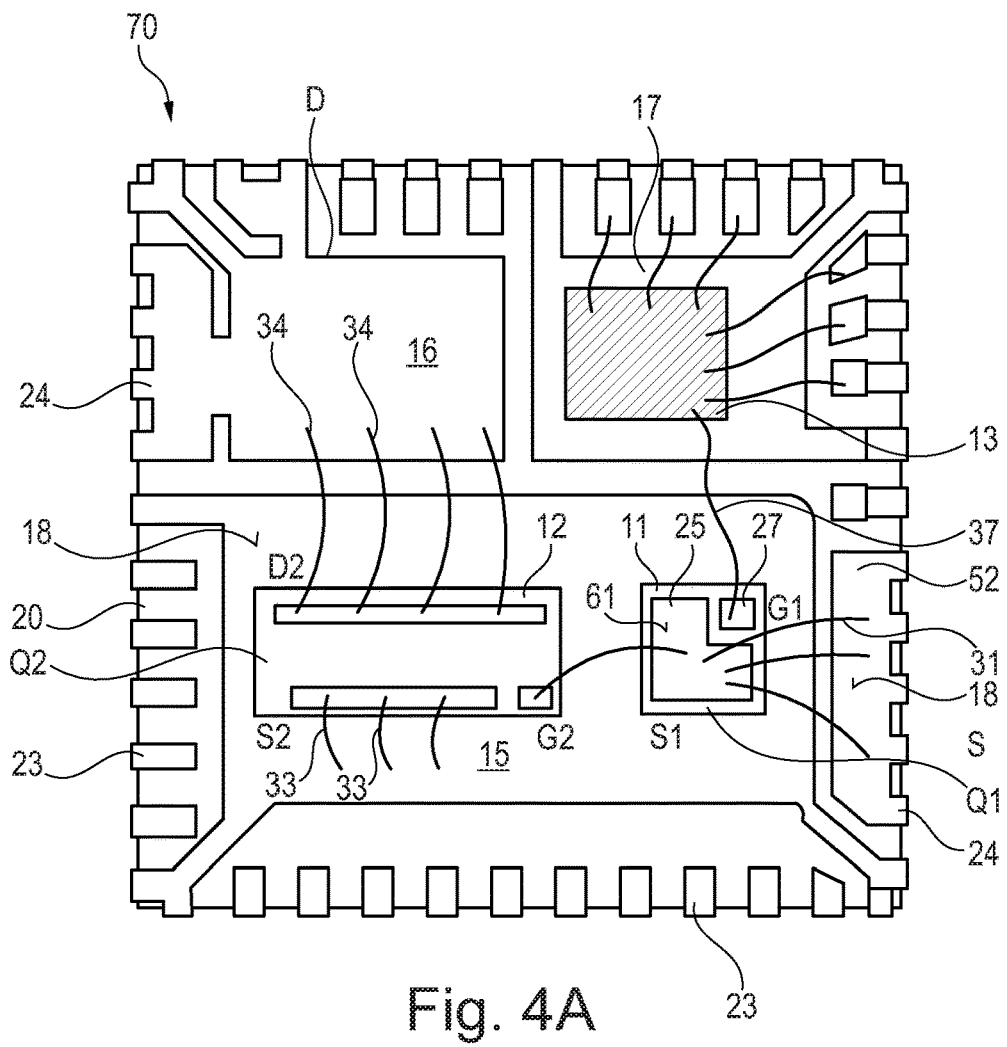
FIG. 4A illustrates a plan view of a semiconductor package according to an embodiment.
Figure 4B:
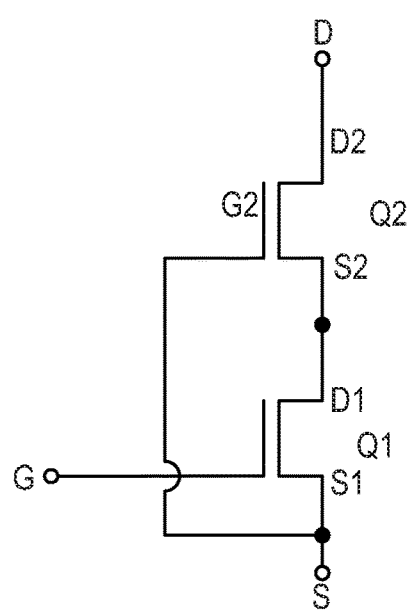
FIG. 4B illustrates a circuit diagram of a cascode configuration that is provided by the package of FIG. 4A.

FIG. 4A illustrates a semiconductor package 70 including first, second and third die pads 15, 16, 17 and first and second power semiconductor devices 11, 12 which are electrically coupled to provide a cascode circuit. The semiconductor package 70 also includes a control device 13 that is mounted on the third die pad 17. FIG. 4B illustrates a circuit diagram of a cascode circuit that is provided by the semiconductor package 70. A cascode circuit and the semiconductor package 70 provides a composite switch including a composite drain D, a composite source S and a composite gate G.

The first power semiconductor device 11 is provided by an enhancement mode transistor device Q1 which in this embodiment is a vertical MOSFET device. The first power semiconductor device 11 includes a source pad 25 and gate pad 27 on its upper surface 61 and drain pad 26 on its lower surface. The drain pad 26 is mounted on the upper surface 18 of the first die pad 15 and is electrically connected to the first die pad 15. The source pad 25 is electrically connected by one or more connectors 31 to one or more leads 23 that are spaced apart from the first die pad 15 to provide the composite source terminal S of the cascode circuit. The gate pad 27 is electrically coupled to the control chip 13 by a connector 37.

The second power semiconductor device 12 is provided by a lateral transistor device Q2 which is a depletion mode device. The second power semiconductor device 12 may be a Group III nitride-based transistor device. Since the second power semiconductor device 12 is a lateral device, it includes a source pad 28, a drain pad 29 and a gate pad 30 its upper surface 61. The source pad 28 is electrically coupled to the first die pad 15 by one or more electrically conductive wires 33 which extend between the source pad 28 and the upper surface 18 of the die pad 15. The source pad 28 of the transistor device Q2 is coupled to the drain pad 26 of the transistor device Q1 by way of the first die pad 15. The drain pad 29 of the transistor device Q2 is electrically connected to the second die pad 16 by one or more electrical connectors 31.

The outer contact surfaces 44 of the leads 24 extending from the second die pad 16 and the lower surface 19 of the second die pad 16, if it is exposed from the mold material 20, provides the composite drain terminal D of the cascode circuit. The gate pad 30 of the second power device semiconductor device 12 is electrically connected to the source pad 25 of the first power semiconductor device by a connector 71 to form the cascode circuit.

Figure 5:
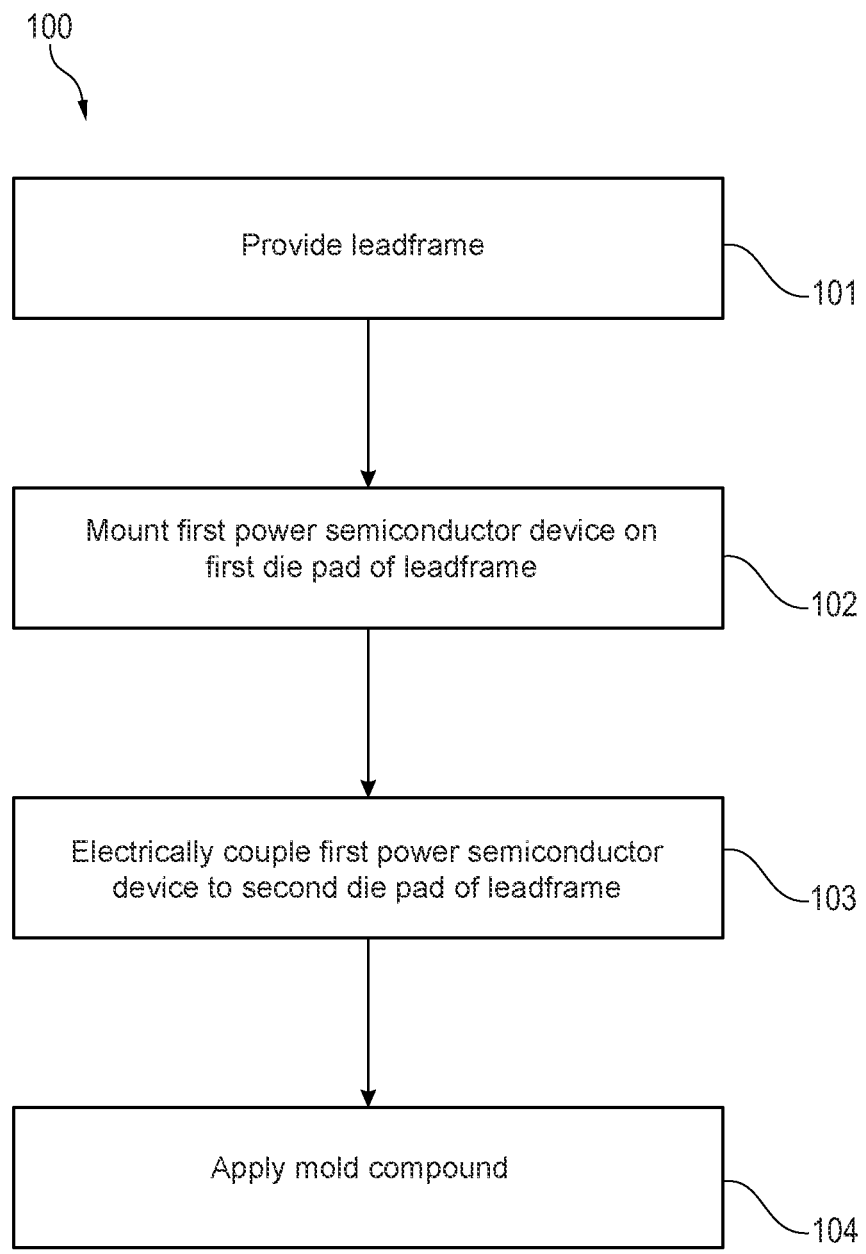
FIG. 5 illustrates a flow chart of a method of fabricating a semiconductor package.

FIG. 5 illustrates a flow chart 100 of a method of fabricating a semiconductor package comprising a first power semiconductor device, a second power semiconductor device and a control semiconductor device. In block 101, a leadframe comprising first, second and third die pads and a plurality of leads is provided. The first, second and third die pads each have an upper surface and a lower surface and are laterally spaced part from one another. A lower surface of the second die pad is spaced apart from a side face of the semiconductor package by a distance that is greater than the length of the individual leads of the plurality of leads. In block 102, the first power semiconductor device is mounted on the upper surface of the first die pad. In block 103, the first power semiconductor device is electrically coupled to the second die pad by one or more first connectors that extend between the first power semiconductor device and the upper surface of the second die pad. In block 104, a mold compound is applied such that the upper surface of the first, second and third die pads is arranged within the mold compound and the upper surface of the second die pad is either occupied by the one or more connectors or is in direct contact with the mold compound.

In further embodiments, the second power semiconductor device is mounted on the upper surface of the first die pad adjacent the first power semiconductor device, and the control device is mounted on the third die pad and the second die pad remains unoccupied by a semiconductor die. The second power semiconductor device is mounted on the upper surface of the first die pad adjacent the first power semiconductor device, and the control device is mounted on the third die pad before the mold compound is applied. However, the second power semiconductor device may be mounted on the upper surface of the first die pad and/or the control device may be mounted on the third die pad before or after the first power semiconductor device is mounted on the first die pad.

In some embodiments, the upper surface of the first die pad includes a solder stop structure and the first and second power semiconductor devices are mounted on the upper surface of the die pad such that the solder stop structure is arranged laterally between the first and second power semiconductor devices.

The solder stop structure may have the form of a trench that is formed in the upper surface of the first die pad. The trench may be formed by etching the upper surface of the leadframe, for example. A trench may be used to collect excess solder material that melts during a solder reflow process, for example. The solder stop structure may have the form of a structured region of a solder resist material. The solder resist material may be deposited on the upper surface of the first die pad and then structured to formed in a pattern on the upper surface of the first die pad. The solder resist structure may be used to contain solder material in the region around the power semiconductor devices. In some embodiments, a trench is formed in the upper surface of the die pad which is lined or filled with solder resist material.

Electrical connections can be formed between the first and second power semiconductor device so as to form a half bridge configuration or a cascode configuration. Electrical connections can be formed such that the second die pad forms the $V_{out}$ terminal of the half bridge configuration, as in the embodiments described with reference to FIGS. 1A-1F and 2, for example, or the $V_{high}$ terminal of the half bridge configuration, as in the embodiments described with reference to FIG. 3, the composite drain terminal of a cascode circuit, as in the embodiment illustrated in FIG. 4A. Electrical connections can be formed such that the first die pad is coupled to ground potential or forms the $V_{low}$ terminal of a half-bridge circuit, as in the embodiments illustrated in FIGS. 1A-1F and 2 or such that the first die pad forms the $V_{out}$ terminal of the half bridge configuration, as in the embodiment illustrated in FIG. 3.

Semiconductor packages are provided which include two or more die pads and two or more semiconductor devices, whereby at least one die pad is used solely as part of the internal electrical redistribution structure of the package rather than as a support structure for a semiconductor device. Thus, an electrical connection having a larger cross-sectional area and, therefore, reduced resistance can be provided by connecting one or more of the semiconductor power devices that are mounted on a different die pad to that unoccupied die pad. For example, one or more electrodes of one or more of the semiconductor power devices that are mounted on a different die pad may be electrically connected to that unoccupied die pad by an electrical connection having in total an increased cross-sectional area. The increase in cross-sectional area may be provide by using a larger number of connectors, for example a larger number of bond wires, and/or a larger connector, e.g. a bond wire of larger diameter or a contact clip. This increase in cross-sectional area of the connection assists in reducing heat generation by current carried in that connection, thus improving the thermal and electrical performance of the package. In some embodiments, the semiconductor device which would commonly be mounted on this die pad is instead mounted on the same die pad as a further semiconductor device.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a leadframe comprising first, second and third die pads and a plurality of individual leads that are spaced apart from the first, second and third die pads and one another, wherein the first, second and third die pads each have an upper surface and a lower surface and are laterally spaced part from one another;
a mold compound, wherein the upper surface of the first, second and third die pads is arranged within the mold compound and the lower surface of the second die pad is exposed from the mold compound and spaced apart from a side face of the mold compound by a distance that is greater than the length of the individual leads;
a first power semiconductor device;
a second power semiconductor device; and
a control semiconductor device,
wherein the individual leads each have an upper surface having a length that extends substantially perpendicularly to the side face of the mold compound,
wherein the first power semiconductor device is mounted on the upper surface of the first die pad,
wherein a drain pad of the first power semiconductor device is electrically coupled to the second die pad by one or more first connectors that extend between the first power device and the upper surface of the second die pad,
wherein the upper surface of the second die pad is either occupied by the one or more first connectors or in direct contact with the mold compound,
wherein the second die pad remains unoccupied by a semiconductor die or semiconductor device and is used solely to provide a portion of an internal electrically conductive redistribution structure.

2. The semiconductor package of claim 1, wherein the one or more first connectors are in contact with the upper surface of the second die pad.

3. The semiconductor package of claim 1, wherein the upper surface of the second die pad extends into an upper surface of at least one lead and a lower surface of the at least one lead is spaced apart from the lower surface of the second die pad by the mold compound.

4. The semiconductor package of claim 1, wherein the first and second power semiconductor devices are mounted on the first die pad and the control device is mounted on the third die pad.

5. The semiconductor package of claim 4, wherein the first die pad is connected to ground potential and the source of the first power semiconductor device and a ground connection of the second power semiconductor device are coupled to the first die pad.

6. The semiconductor package of claim 4, wherein the upper surface of the first die pad extends into a lead and a source of the first power semiconductor device is coupled to the lead by a second connector.

7. The semiconductor package of claim 1, wherein the first power semiconductor device is a lateral transistor device with source, drain and gate pads on its upper surface.

8. The semiconductor package of claim 1, wherein the second power semiconductor device is a lateral transistor device with source, drain and gate pads on its upper surface, and wherein the source pad of the second power device is coupled to the second die pad.

9. The semiconductor package of claim 1, wherein the first and second power semiconductor devices are coupled to form a half-bridge configuration or a cascode configuration.

10. The semiconductor package of claim 9, wherein the first and second power semiconductor devices are coupled to form a half-bridge configuration, and wherein the second die pad and/or leads that are integral with the second die pad provide an output terminal or a high-voltage terminal of the half-bridge configuration.

11. The semiconductor package of claim 1, further comprising a solder stop structure arranged on or in the upper surface of the first die pad and between the first power semiconductor device and the second power semiconductor device.

12. The semiconductor package of claim 11, wherein the solder stop structure is a trench formed in the upper surface of the first die pad and/or a structured region of solder resist.

13. A semiconductor package of claim 12, wherein the upper surface of each of the first, second and third die pads has an area of 4 mm$^2$ or greater and a minimum lateral dimension of 1.5 mm, and wherein the individual leads have a lower surface with a maximum area of 3 mm$^2$.

14. The semiconductor package of claim 1, wherein the drain pad of the first power semiconductor device is electrically coupled to the second die pad by at least two first connectors that extend between the first power device and the upper surface of the second die pad.

15. The semiconductor package of claim 1, wherein a source pad of the second power semiconductor device is electrically coupled to the drain pad of the first power semiconductor device and/or to the second die pad by one or more second connectors.

16. A method of fabricating a semiconductor package comprising a first power semiconductor device, a second power semiconductor device and a control semiconductor device, the method comprising:
providing a leadframe comprising first, second and third die pads and a plurality of individual leads that are spaced apart from the first, second and third die pads and one another, wherein the first, second and third die pads each have an upper surface and a lower surface and are spaced part from one another;
mounting the first power semiconductor device on the upper surface of the first die pad;
electrically coupling to the second die pad by one or more first connectors that extend between a drain pad of the first power semiconductor device and the upper surface of the second die pad; and
applying a mold compound such that the upper surface of the first, second and third die pads is arranged within the mold compound and the upper surface of the second die pad is either occupied by the one or more first connectors or in direct contact with the mold compound,
wherein the individual leads each have an upper surface having a length that extends substantially perpendicularly to a side face of the mold compound,
wherein a lower surface of the second die pad is spaced apart from the side face of the mold compound by a distance that is greater than the length of the individual leads,
wherein the second die pad remains unoccupied by a semiconductor die or semiconductor device and is used solely to provide a portion of an internal electrically conductive redistribution structure.

17. The method of claim 16, wherein the second power semiconductor device is mounted on the upper surface of the first die pad adjacent the first power semiconductor device and the control device is mounted on the third die pad.

18. The method of claim 17, wherein the upper surface of the first die pad includes a solder stop structure and the first and second power semiconductor devices are mounted on the upper surface of the die pad such that the solder stop structure is arranged laterally between the first and second power semiconductor devices.

19. The semiconductor package of claim 1, wherein the upper surface of the second die pad has a larger lateral area than the lower surface of the second die pad.

20. The method of claim 16, wherein the upper surface of the second die pad has a larger lateral area than the lower surface of the second die pad.

* * * * *